United States Patent [19]
Wiedmann et al.

[11] Patent Number: 5,467,311
[45] Date of Patent: Nov. 14, 1995

[54] CIRCUIT FOR INCREASING DATA-VALID TIME WHICH INCORPORATES A PARALLEL LATCH

[75] Inventors: Siegfried K. Wiedmann, Stuttgart; Dieter F. G. Wendel, Sindelfingen, both of Germany

[73] Assignee: International Business Machines Corporation, Armonk, N.Y.

[21] Appl. No.: 560,696

[22] Filed: Jul. 31, 1990

[51] Int. Cl.⁶ ..................................................... G11C 7/02
[52] U.S. Cl. ................................. 365/189.05; 365/233
[58] Field of Search ............................ 365/189.05, 233, 365/189.01

[56] References Cited

U.S. PATENT DOCUMENTS

| | | |
|---|---|---|
| 4,564,772 | 1/1986 | Maley et al. . |
| 4,703,458 | 10/1987 | Stipanuk ............................ 365/189.05 |
| 4,843,264 | 6/1989 | Galbraith . |

FOREIGN PATENT DOCUMENTS

0329910A1  8/1989  European Pat. Off. .

OTHER PUBLICATIONS

"Increased Valid–Data Readout Time in Static RAM" by J. A. Lawrence in IBM Technical Disclosure Bulletin vo. 25, #6, Nov. 1982 p. 2865.

Primary Examiner—Joseph E. Clawson, Jr.
Attorney, Agent, or Firm—Thomas J. Kilgannon, Jr.; David Aker; Blaney Harper

[57] ABSTRACT

This invention relates generally to the accessing of random access access memory arrays and, more specifically to circuits and techniques for increasing the data valid time of such memory arrays without increasing either the access or cycle times of the array. This is accomplished by providing, during a read cycle, a read signal directly to an output driver and simultaneously providing, via a parallel path, a latch output to the same driver. The latch output is provided under control of the read signal and a returning portion of a clock pulse such that the latch output overlaps the direct read signal from a read/write amplifier. An output is provided from the latch until it is reset and may last well into the next read cycle even when a new read signal is present. The technique utilized, in addition to providing a longer data valid time, eliminates a response of the latch to spurious read signals because a latch output is not provided until the clock is deactivated and such spurious read signals are not present during the returning portion of the clock cycle. The approach utilized also has the advantage that delays associated with prior art serially disposed latches are eliminated.

15 Claims, 5 Drawing Sheets

CIRCUIT FOR INCREASING DATA-VALID TIME WHICH INCORPORATES A PARALLEL LATCH

FIELD OF THE INVENTION

This invention relates generally to the accessing of random access access memory arrays and, more specifically to circuits and techniques for increasing the data valid time of such memory arrays without increasing either the access or cycle times of the array. This is accomplished by providing, during a read cycle, a read signal directly to an output driver and simultaneously providing, via a parallel path, a latch output to the same driver. The latch output is provided under control of the read signal and a returning portion of a clock pulse such that the latch output overlaps the direct read signal from a read/write amplifier. An output is provided from the latch until it is reset and may last well into the next read cycle even when a new read signal is present. The technique utilized, in addition to providing a longer data valid time, eliminates a response of the latch to spurious read signals because a latch output is not provided until the clock is deactivated and such spurious read signals are not present during the returning portion of the clock cycle. The approach utilized also has the advantage that delays associated with prior art serially disposed latches are eliminated.

BACKGROUND OF THE INVENTION

A certain minimum data valid time for the data-out signal of a memory array system is necessary in each such system to obtain a window for recognizing the data coming from the array. Two approaches have been utilized in the prior art to achieve this goal. One approach shown in FIG. 1 is to extend the clock active time as long as necessary to obtain a proper data-out pulse. Extending the clock active time results automatically in a longer cycle time as shown in FIG. 1. Of course, as shown by the Data Out pulses in FIG. 1, the time during which data is valid is also extended. This approach is normally unacceptable since it obviously increases the overall machine cycle time.

A second commonly used approach is to introduce a latch into the memory array data-out path as shown in FIG. 2. The use of the serially disposed latch, of course, introduces a delay. In the arrangement of FIG. 2, an output from a Sense-Read Amplifier sets a Latch in response to a Set input and holds that level until a Reset signal is applied. The data-valid time at the input of the Data Out Driver is, therefore, a function of the set and reset times arid the amount of time the latch takes to provide an output. An example of a circuit utilizing a cascaded data latch is shown in an article entitled "Increased Valid-Data Readout Time in Static RAM" by J. A. Lawrence in IBM Technical Disclosure Bulletin, Vol. 25, No. 6, November 1982, page 2865. In the arrangement of the article, a second, cascaded output latch is utilized to increase the data-valid time. The addition of the latch causes the read data output to be valid during the entire cycle time except for a relatively small switching delay of the second latch, but the access time is impacted by the signal propagation through the latch.

It is, therefore, an object of the present invention to provide a circuit which increases the data valid time of a read signal without increasing either the access or cycle time of a memory array.

Another object is to provide a circuit in which delays due to serially disposed circuit elements between a sense/read amplifier and a data out driver are eliminated.

Still another object is to provide a circuit arrangement wherein a read/sense signal and a latch output signal are overlapped to provide a long data valid time without increasing access or cycle time.

Yet another object is to provide a circuit arrangement wherein the time during which data is valid is extended by using a portion off the next clock cycle during which another read or write signal may be present.

BRIEF SUMMARY OF THE INVENTION

This invention relates to a circuit arrangement which extends the time during which data is valid without changing the access time or cycle tithe by extending the duration of a data valid signal into a portion of the next clock cycle when another read or write signal may be present. This is accomplished by setting a parallel latch on the returning portion of a clock pulse, CL (The rising portion of a clock not clock pulse CLnot). To the extent that a Read Signal is not used until the clock pulse, CL, is over or until CLnot begins, a latch can be activated and remain in that state for some portion of the next read cycle. That period of time is determined by the time when a Reset pulse is applied to the latch. Thus, the latch applies an output to the input of a Data Out Driver from the time the latch is set until the time it is reset. Apart from the latch output presented to the Data Output Driver, the Read Signal is applied directly to the Driver so that it overlaps the output of the latch providing a signal which appears at the input to the Driver for a time starting with the rise of the Read Signal to the rise of the Reset Signal. Thus, even though the Read Signal has disappeared, the Latch Data remains having been started by the presence of CLnot and the Read Signal itself. To the extent that CLnot is controlled, this determines how Far into the next clock cycle the Latch Data can be extended. In the circuit arrangement disclosed herein, data is invalid for a time beginning with the resetting of the parallel latch, the rise of the Reset pulse and the end of the access time which began on the fall of a CLnot pulse. Thus, to the extent spurious data appears at the output, it falls into a data invalid period and would not: be read, since it is not within the specified access time. Also, there is no output from the Latch since its activation depends on the presence of both CLnot and a Read Signal.

The foregoing and other objects and features of the present invention will become more apparent from the following more particular description of a preferred embodiment taken in conjunction with the following drawings.

DESCRIPTION OF A PREFERRED EMBODIMENT

Figure 1:
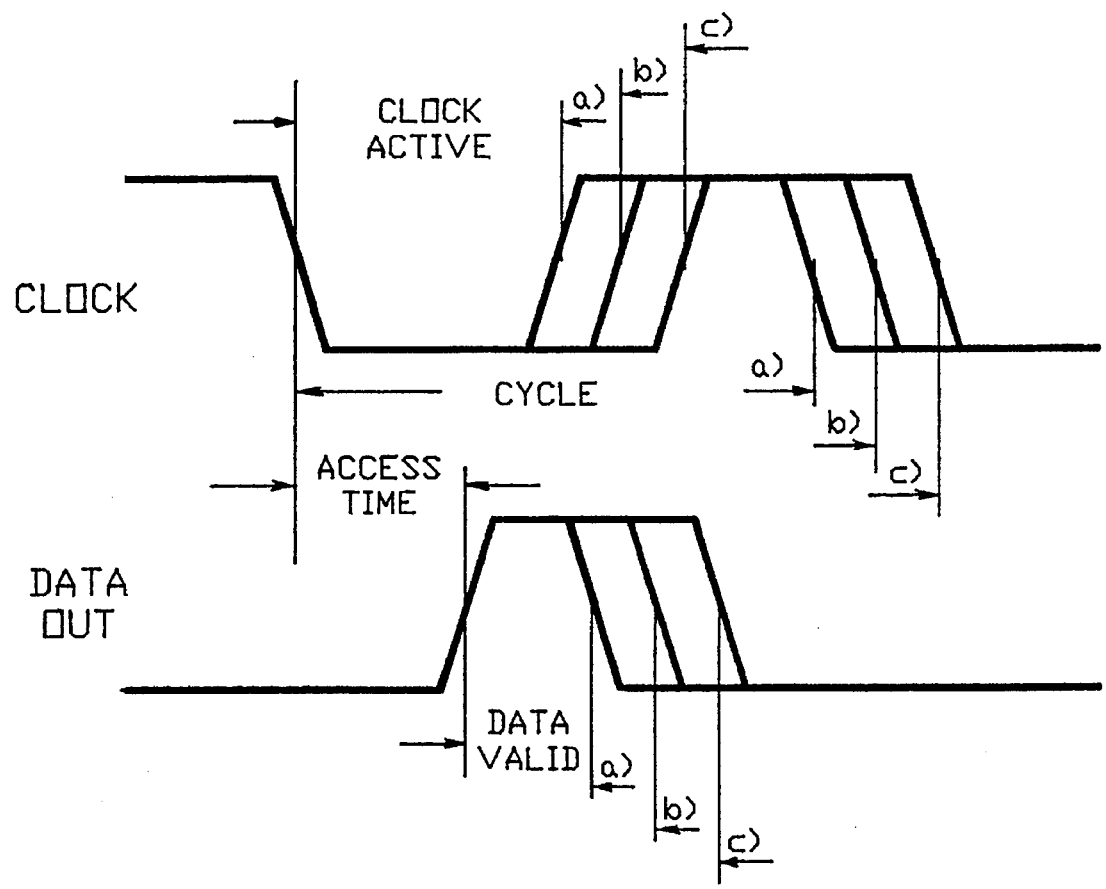
FIG. 1 is a pulse pattern of Clock and Data Out signals of a prior art approach wherein the Clock Active time is extended as long as necessary to obtain a desired Data Out Pulse.
Figure 2:
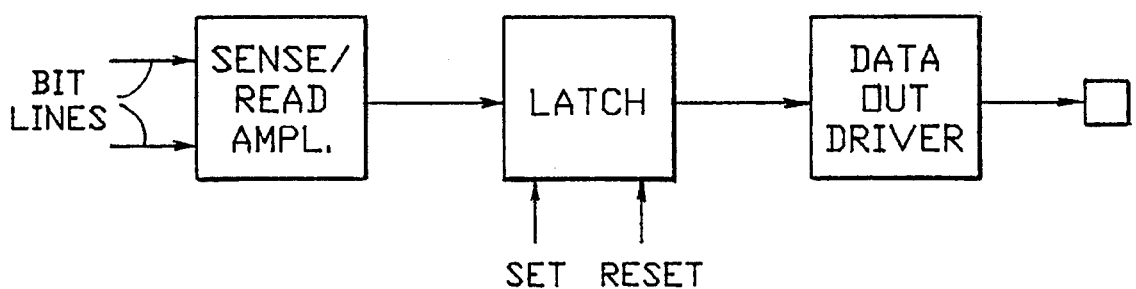
FIG. 2 is a block diagram of a prior art arrangement For prolonging the Data Valid Time by extending the Clock Active time showing a latch disposed in series in the Data Out path in a memory system.
Figure 3:
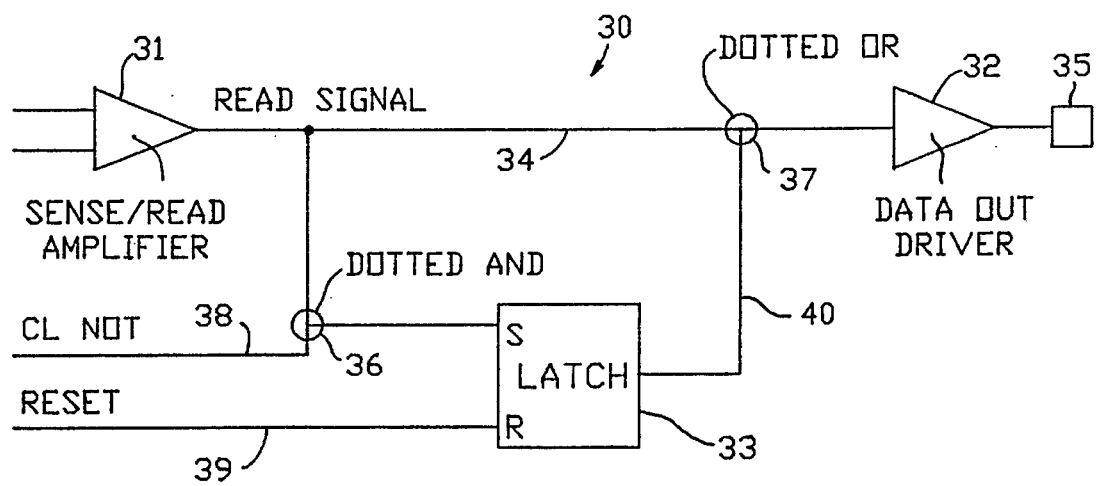
FIG. 3 is a block diagram of a circuit which, in accordance with the teaching of the present invention, increases the time during which data is valid without increasing either access or cycle time of a memory array. The key to implementing this result is the use of a parallel latch.

Referring now to FIG. 3, there is shown a block diagram of a circuit 30 which, in accordance with the teaching of the present invention, increases the time when data is valid without increasing either access time or cycle time of a memory array.

Figure 4:
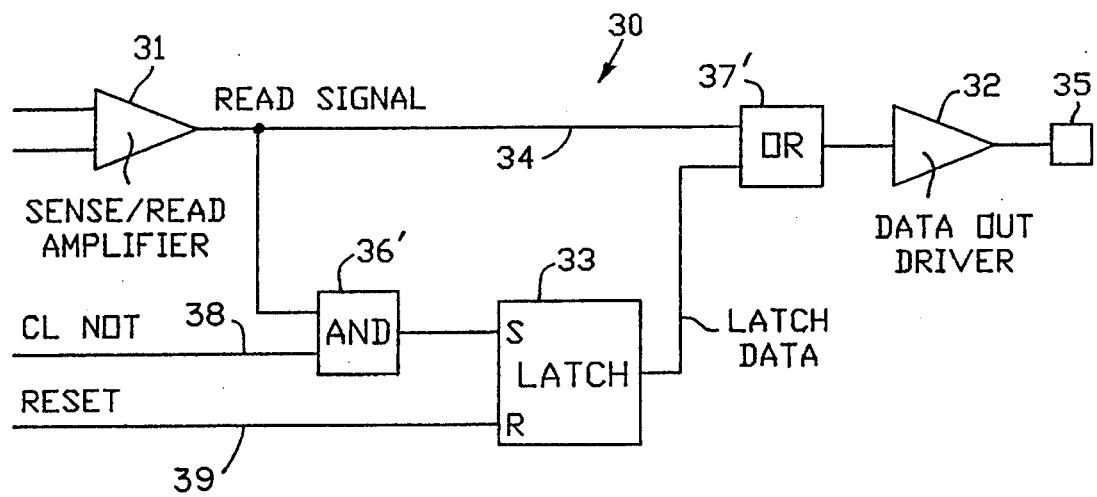
FIG. 4 is a block diagram of a circuit similar to that shown in FIG. 3 except that the dotted OR and AND arrangement have been replaced by OR and AND gate circuits respectively.

Circuit 30 of FIG. 3 broadly consists of three circuit elements; a sense/read amplifier 31; a data out driver 32 and a data latch 33. The latter is connected in parallel with a read signal path 34 which interconnects amplifier 31 and driver 32. Driver 32 is shown connected to a block 35 which may be, another portion of a general purpose digital computer which utilizes the output of driver 32. In FIG. 3, connection points 36,37 are dotted AND and dotted OR connections, respectively, which substitute for logical AND and OR circuits, respectively, in a manner well known to those skilled in the digital circuitry art as shown in FIG. 4. A read signal output from amplifier 31 is fed to the input of driver 32 via dotted OR connection 37 and to the set terminal S of latch 33 via clotted AND interconnection 36. Another signal which is the complement of the chip clock is applied to interconnection line 38 and fed via clotted AND connection 36 to set terminal S of latch 33. Interconnection line 38 is also identified by the reference CLnot in FIG. 3. Interconnection line 39, also identified in FIG. 3 by the reference Reset, provides a reset signal to the Reset Terminal R of latch 33. The output of the latter is then applied via interconnection line 40 and dotted OR connection 37 to the input of data out driver 32.

In operation, the circuit of FIG. 3 provides an output from driver 32 in response to signals from amplifier 31 and from latch 33 for a period of time starting with the onset of a read signal from amplifier 31 and ending with the onset of a reset signal on the reset terminal R of latch 33. As will be seen hereinbelow in the discussion of the timing signals applied to the various elements of FIG. 3, circuit 30 provides a data valid signal which can be extended into a portion of the next clock cycle even though another read operation has been started. Further, it will be seen hereinbelow that the time during which data is valid has been extended results from the overlapping of the read signal from amplifier 31 and the output of latch 33 when they appear at the input of driver 32. To the extent that the prior art serially disposed latch is eliminated, any delay associated with it is also eliminated.

Before addressing the operation of FIG. 3 in more detail, it should be appreciated that the dotted AND connection 36 and dotted OR connection 37 may be substituted for by actual AND and OR gates without departing from the spirit of the present invention. Thus, FIG. 4 shows the same block diagram as FIG. 3 except that interconnection 36 has been substituted for by AND gate 36' and interconnection 37 has been substituted for by OR gate 37'. Except for the simplification of FIG. 3, FIG. 4 operates in the same manner as FIG. 3 and the timing signals of FIGS. 5, 6 can be used in conjunction with either of FIGS. 3, 4.

Figure 5:
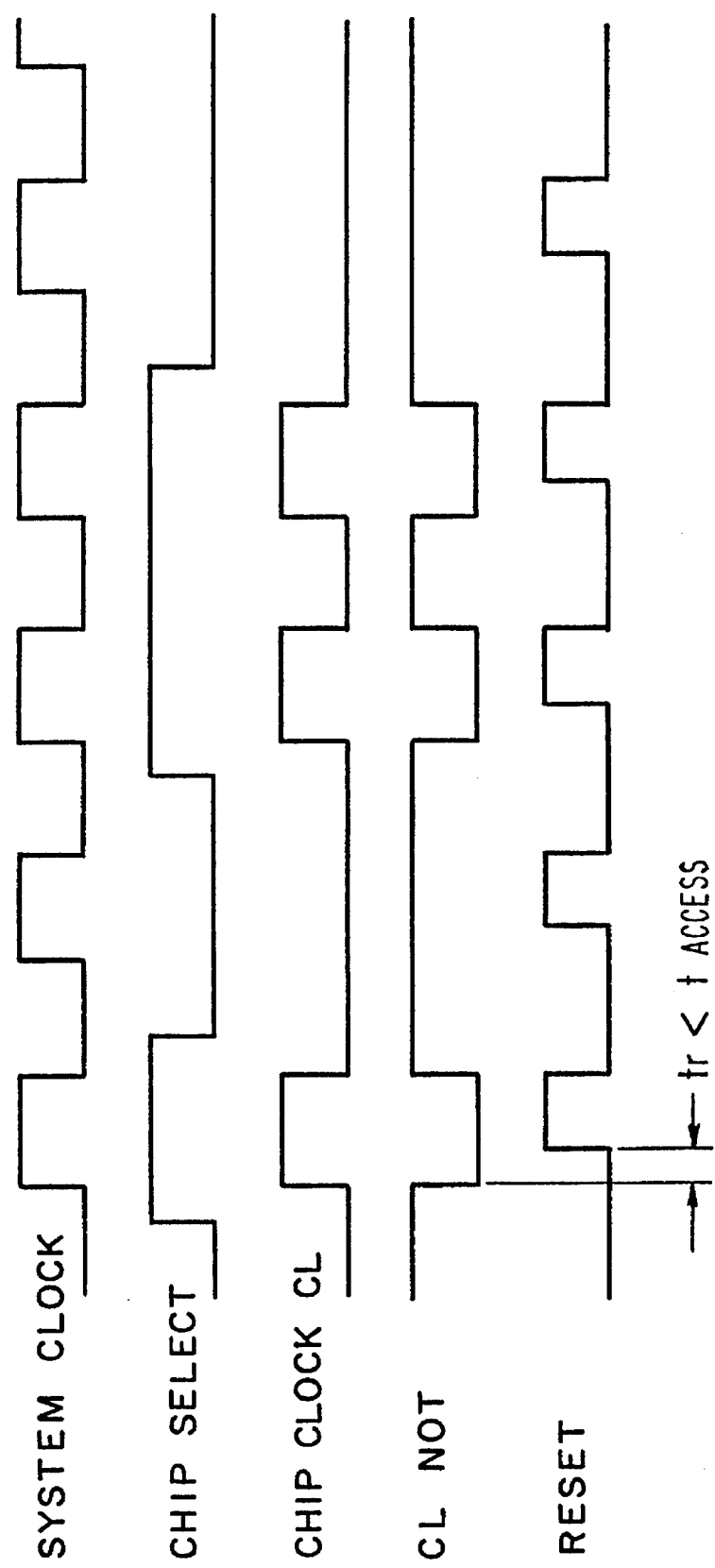
FIGS. 5 and 6 show the timing signals for chip control and for activating and controlling the circuit elements of FIG. 3, respectively.
Figure 6:
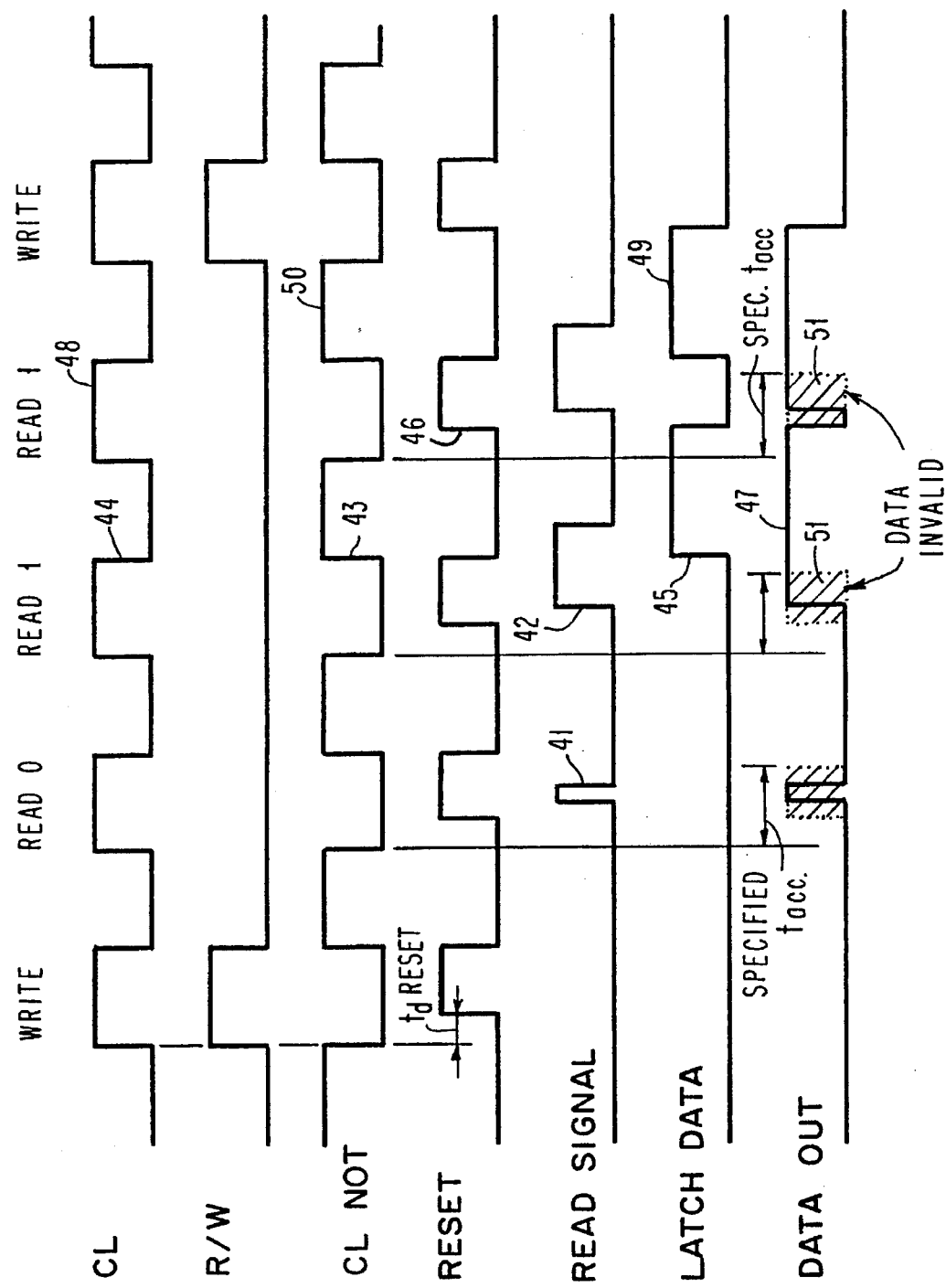

FIGS. 5 and 6 show the tinning signals for chip control and for activating and controlling the circuit elements respectively, of FIG. 3. Thus, FIG. 5 shows System Clock, Chip Select, Chip Clock CL, CLnot and Reset timing pulses and their relationship to one another. FIG. 6 shows CL, R/W, CLnot, Reset, Read Signal, Latch Data and Data Out pulses and their relationship to one another. In the discussion which follows, it should be appreciated that the valid read signal is present at the time CL falls from a high level to a low level or when CLnot rises from a low level to a high level. Recalling that CLnot sets latch 33 if a read signal is also present at set terminal S, it should also be appreciated that this expedient prevents spurious read signals which occur during a read cycle before the activation of the CLnot signal from setting latch 33. Thus, Read Signal pulse 41 of FIG. 6, will pass directly to the input of driver 32 via interconnection 34 but it occurs earlier than the specified access time, tacc, for the system. Therefore, it does not set latch 33, since CLnot is not high. The Read Signal pulse shown at 42 in FIG. 5 which extends into the time period when tile CLnot signal becomes high, will drive data out driver 32 by itself, so that the Data Out signal appears at its output practically without any impact by the latching function. Then, because Read Signal pulse 42 is present or high on the rising edge of a CLnot pulse 43 (the falling edge of CL pulse 44), latch 33 will be set when both the Read Signal pulse 42 and CLnot pulse 43 are positive simultaneously. Once latch 33 is set as indicated by the rising edge of Latch Data pulse 45 in FIG. 6, it remains in that condition until latch 33 is reset by the application of the rising edge of Reset pulse 46 also shown in FIG. 6. As shown in FIGS. 5, 6, latch 33 is reset to zero at the beginning of the next System Clock cycle by the onset of a Reset pulse. The Reset pulse may, however, be slightly delayed by a time, $t_dReset$ which must be smaller than the data access time, tacc. Simultaneously, with the resetting of latch 33, latch 33 no longer provides an output as indicated by the falling edge of Latch Data pulse 45 in FIG. 6. A careful consideration of the Read Signal and Latch Data pulses 42, 45, respectively, shows that data is present at driver 32 from the time the rising edge of Read Signal pulse 42 is present until the time the falling edge of Latch Data pulse 45 occurs. This is shown in FIG. 6 by Data Out pulse 47, the rising edge of which is coincident with the rising edge of Read Signal 42 and the falling edge of which is coincident with the rising edge of Reset pulse 46. In connection with Data Out pulse 47, it should be noted that it remains high well into the occurrence of the next read cycle as indicated in FIG. 6 by the presence of CL pulse 48. Note that the falling edge of Data Out pulse 47 is so timed that it occurs when CL pulse 48 is high. This lengthening of the Data Out pulse 47 is possible because, even though Read Signal 48 is present, Latch Data pulse 49 is not present until CLnot pulse 50 undergoes a rising transition. The hatched area 51 in FIG. 6 is the data invalid time of the Data Out signal. During this period, the previous data from Clock 44 is no longer valid, and the new data from clock pulse 48 is not yet valid. From all the foregoing, it should be clear, that the time data remains valid has been considerably extended without affecting either access time or tile cycle time. It is submitted that the foregoing approach allows the fastest possible access time without impacting the cycle time.

Figure 7:
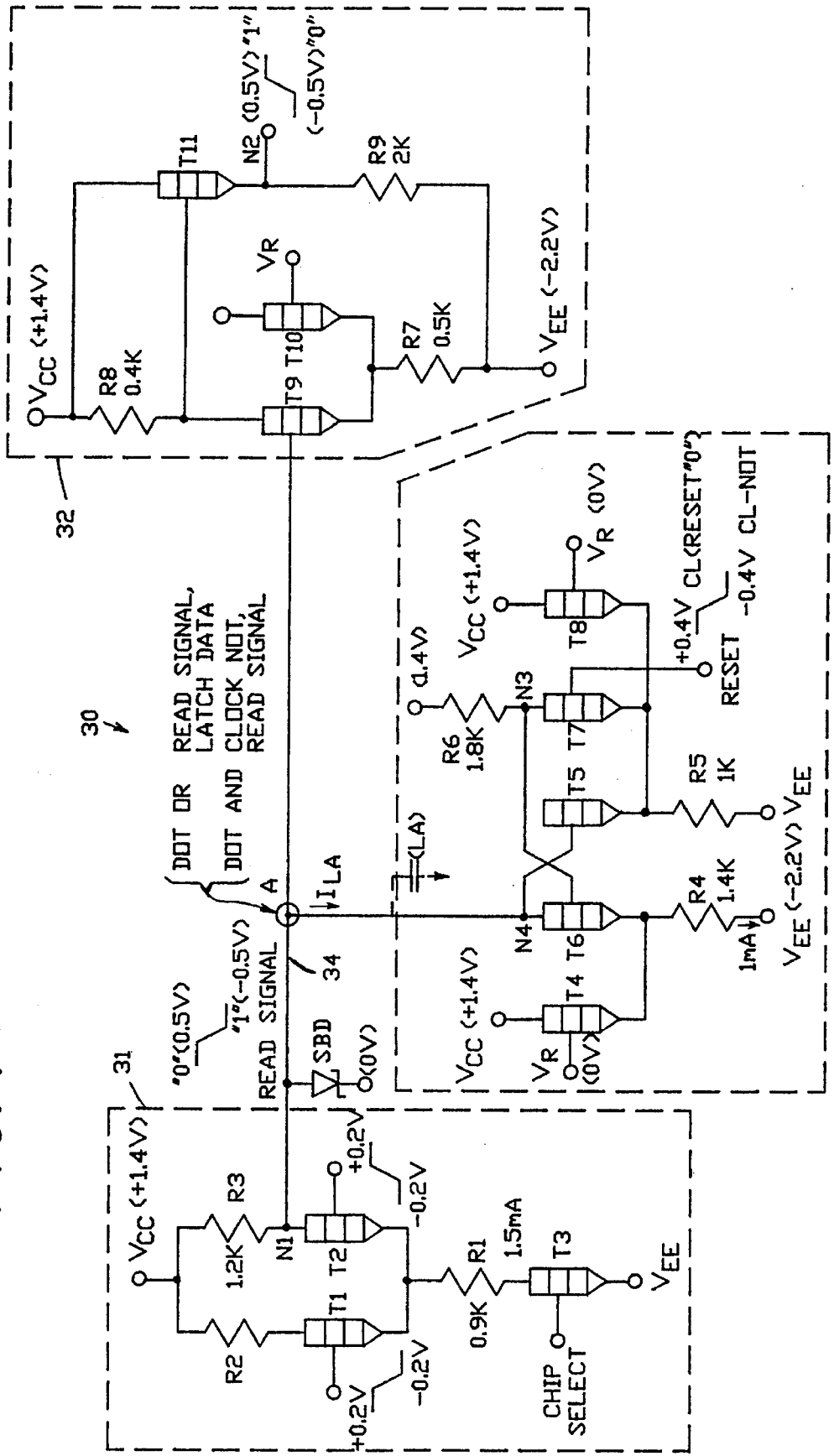
FIG. 7 is a schematic diagram of an ECL (Emitter Coupled Logic) circuit in accordance with the teaching of tile present invention which shows tile circuit implementations of the sense/read amplifier, latch and data out driver of FIG. 3

FIG. 7 is a schematic diagram of an ECL (Emitter Coupled Logic) circuit in accordance with the teaching of the present invention. In FIG. 7, the elements which are the same as those shown in FIG. 3 are identified with the same reference characters as used in FIG. 3.

In FIG. 7, sense/read amplifier 31 of FIG. 3 is implemented by a differential read amplifier circuit disposed within dashed box 31; latch 33 is implemented with a combined latch and control circuit disposed within the confines of dashed box 33 and data out driver 32 is implemented using a conventional ECL data out driver disposed within the confines of dashed box 32.

Amplifier 31 is the final stage of a differential read amplifier with complementary input signals and single ended output signals. Thus, transistors T1, T2, which are npn transistors, have their emitters connected via a resistor R1 and a chip select transistor T3 to a voltage source $V_{EE}$(−2.2V). The latter is connected to the emitter of transistor T3 while the base of transistor T3 is connected to a pulsed source which provides a Chip Select pulse as shown in FIG. 5. The collectors of transistors T1, T2 are connected to a source of collector voltage $V_{cc}$ which may be 1.4V via resistors R2, R3, respectively, while their bases are connected to complementary signals in such a way that the signal on the base of transistor T1 is falling simultaneously from 0.2V to −0.2V with the rising of the signal from −0.2V to 0.2V on the base of transistor T2. As a result of the application of these symmetrical input signals, transistor T1 turns OFF and transistor T2 turns ON and the latter draws a current defined by resistor R1 which has, for example, a value of 0.9K ohms. This current multiplied by R3, which like R2 has a value of 1.2K ohms, results in a decreasing output signal at node N1 and is identified in FIG. 7 by the term Read Signal. A Schottky barrier diode SBD is connected at one electrode to node N1 and at the other electrode thereof to zero volts. The function of SBD is to clamp the up level of the Read Signal to 0.5V. The down level is given by the difference between $V_{cc}$ and the voltage drop across resistor R3, which results in a down level of approximately −0.5V. The resulting Read Signal propagates along interconnection 34 via connection A to the base of transistor T9 which forms a part of data out driver 32. In the embodiment of FIG. 7, connection A functions both as the clotted OR 37 and dotted AND 36 shown in FIG. 3. Thus, the Read Signal at connection A passes directly to the base of npn transistor T9 where a down level of −0.5V (representative of a binary "1") turns that device OFF and resistor R8, which is connected to $V_{cc}$ and to the collector of transistor T9, pulls the input of emitter Follower T11 up. A binary "1" signal appears at output terminal N2 without any clocking or gating function being involved. After activating the read amplifier 31, the resulting output is similar to Read Signal 42 shown in FIG. 6. In FIG. 7, driver 32 also includes a resistor R7 having a value of 0.5K ohms one end of which is connected to the emitter of npn transistors T9, T10 and the other end of which is connected to $V_{EE}$(−2.2V). Finally, emitter follower transistor T11 has its emitter connected via a resistor R9 having a value of 2K ohms to $V_{EE}$. The collector of transistor T11 is connected to $V_{CC}$(1.4V). To the extent a negative down level on the base of transistor T9 causes that device to turn OFF during the time the Read Signal is present, it follows that a similar down level signal will keep transistor T9 OFF even though the Read Signal is no longer present. This negative down level is provided by latch 33. Before discussing the components and operation of latch 33, it should be appreciated that the Read Signal has been propagated from amplifier 31 to driver 32 without any noticeable delay by latch and control circuitry 33 because effective capacitance C(LA) is affected very little by the latch terminal N4.

Returning now to FIG. 7, latch 33 includes npn transistors T4–T8. Transistors T5, T6 form a cross-coupled pair with the collector of T6 being coupled to the base of T5 and the collector of the latter being coupled to the base of the former. The emitter of T6 is connected to $V_{EE}$(−2.2V) via a resistor R4 of value 1.4K ohms and the emitter of T5 is connected to $V_{EE}$ via a resistor R5 of value 1K ohm. The collector of T6 is connected via node N4 to connection A while the collector of T5, in addition to being connected to the base of T6, is connected via resistor R6 (1.8K ohms) to $V_{CC}$(+1.4V). Transistor T7 is connected across transistor T5 with their collectors and emitters being connected together. The base of transistor T7 is connected to a Reset Terminal at which a high level of 0.4V represents a CL signal and a down level of −0.4V represents a CLnot signal. In FIG. 7, npn transistors T4 and T6 have their emitters connected together. The collector of T4 is connected to $V_{CC}$ and its base is connected to $V_R$(OV). Similarly, transistors T8, T5 and T7 have their emitters connected together. The collector of T8 is connected to $V_{CC}$ and its base to $V_R$.

In operation, latch 33 is set by the presence of Read Signal and CLnot pulses of FIG. 6 at the appropriate inputs of latch 33 in FIG. 7. In FIG. 7, a Reset signal which is a binary "0" has a high level of 0.4V and is applied to the Reset Terminal which connects to the base of npn transistor T7 turning that device ON. Conversely, a low level signal of −0.4V applied to Reset Terminal of T7 turns that device OFF. The low level is representative of a CLnot pulse.

At the beginning of a cycle, latch 33 is reset by the application of 0.4V (Reset Signal) to the base of transistor T7 turning that device ON. When T7 goes ON, the potential at node N3 drops to approximately −0.3V. The falling potential on node N3 is connected to the base of transistor T6 causing that device to turn OFF. Latch 33 can now receive an up or down Read Signal. If the Read Signal is a logical "1" or a −0.5V level, this potential which is cross-coupled to the base of transistor T5 causes that device to be turned OFF. As soon as CLnot (−0.4 V) is applied via the Reset Terminal to the base of T7 which is in the ON state, transistor T7 is turned OFF. The potential at node N3 rises, turning T6 which was OFF to the ON state. This causes node N4 to fall to approximately −0.5V, applying a more negative potential to the base of transistor T9 keeping T9 OFF. Thus, T9 is held in the OFF condition as long as CLnot is applied when Read Signal is negative. When Read Signal "1" disappears at amplifier 31 output, latch 33 remains in the "1" state as long as transistor T7 is kept OFF by a CLnot signal on its base. When T9 is nonconducting, transistor T11 is turned ON and a logical "1" of 0.5V appears at node N2. On the other hand, if Read Signal is a logical "0" or 0.5V, transistor T5 is turned ON, node N3 is approximately −0.3V, causing a negative potential at the base of T6, keeping that device OFF. Transistor T6 will be kept in the OFF condition, when transistor T7 is turned OFF by the application of CLnot of −0.4V on the base of transistor T7. Latch 33 is now set in a logical "0" state and will remain in that state. The positive state of latch 33 is communicated from node N4 via connection A (which now operates as a dotted OR) to apply the positive potential to the base of transistor T9 turning that device ON and causing a logical "0" of −0.5V to appear at N2. In FIG. 7, transistor T4 is the reference transistor for the current switch consisting of transistors T4, T6; T8 is tile reference transistor for the current switch consisting of transistors T5, T7 AND T8; T10 is the reference transistor for current switch consisting of transistors T9, T10.

In the foregoing, npn transistors have been used to describe a preferred embodiment. However, an equally preferred embodiment may be obtained by using pnp transistors while reversing the polarity of all voltages and retaining the magnitudes shown.

From all the foregoing, it should be clear, that the time when data is valid has been increased without affecting access or cycle time. A relatively simple circuit has been provided which, using a single interconnection, carries out the functions of prior art AND and OR gates.

Having thus described our invention what we claim as new and desire to secure as Letters Patent, is:

1. A circuit for extending the data valid time for a data output driver which includes a source of system clock pulses comprising:

a data output driver circuit, a sense/read amplifier connected to said data output driver via a signal path which provides one of high and low signal outputs during an interval when a pulse from said source of system clock pulses is present, and means connected in parallel with said signal path for applying an input to said driver of said one of said high and low signal outputs during an interval when the complement of said pulse activates said means for applying.

2. A circuit according to claim 1 wherein said means for applying includes a resettable latch having an input/output terminal connected to said signal path.

3. A circuit according to claim 2 wherein said means for applying includes control means connected to said latch responsive to a signal representative of the complement of said pulse and to a reset signal for applying one of high and low signal outputs to said input/output terminal when said one of high and low signal outputs, respectively, is applied from said amplifier to said input/output terminal and said complement of said pulse activates said control means.

4. A circuit according to claim 3 wherein said resettable latch includes a pair of cross-coupled npn bipolar transistors the collector of one of said pair of transistors and the base of the other of said pair of transistors being connected to said input/output terminal.

5. A circuit according to claim 4 wherein said control means includes an npn bipolar transistor the collector and emitter of which are connected to the emitter and collector of said other of said pair of transistors and base of which is connected to a pulsed source which provides at one signal level a signal representative of the complement of said pulse and at another signal level said reset signal.

6. A circuit for extending the data valid time for a data output driver which includes a source of system clock pulses comprising, a sense/read amplifier which provides output signals representative of a binary one and a binary zero during an interval when a pulse from said source of system clock pulses is present, a data out driver connected to the output of said amplifier via a signal path, and a latch circuit connected in parallel with said signal path said latch being set by the complement of said pulse such that said data out driver is activated by the overlapping of one of said output signals and the output of said latch circuit until said latch is reset.

7. A circuit according to claim 6 wherein said latch circuit includes control means connected to said latch responsive to a signal representative of the complement of said pulse and to a reset signal for applying one of a high and low latch output signal to said signal path when one of said output signals is applied from said amplifier to said latch and said complement of said pulse activates said control means.

8. A circuit according to claim 7 further including logical circuit means connected to said latch for setting said latch when said one of said output signals and the complement of said pulse are applied simultaneously to said latch.

9. A circuit according to claim 7 further including logical circuit means the output of which is connected to said data out driver and one input of which is connected to said latch and the other input of which is connected to said sense/read amplifier.

10. A circuit for extending the data valid time for a data output driver which includes a source of system clock pulses comprising, a sense/read amplifier which provides output signal representative of a binary one and a binary zero during an interval when a pulse from said source of system clock pulses is present, a data out driver connected to the output of said amplifier via a signal path, a latch circuit connected in parallel with said signal path, said latch being set by the complement of said pulse such that said data out driver is activated by the overlapping of one of said output signals and the output of said latch circuit until said latch is reset;

said latch circuit includes control means connected to said latch responsive to a signal representative of the complement of said pulse and to a reset signal for applying one of a high and low latch output signal to said signal path when one of said output signals is applied from said amplifier to said latch and said complement of said pulse activates said control means; and a logical circuit means connected to the input of said latch for setting said latch when said one of said output signals and the complement of said system clock pulse are applied simultaneously to said input of said latch;

said logical circuit means includes an AND gate one of the inputs of which is connected to said amplifier and the other input of which is connected to a source which provides the complement of said system clock pulse and the output of which is connected to said input of said latch.

11. A circuit for extending the data valid time for a data output driver which includes a source of system clock pulses comprising, a sense/read amplifier which provides output signals representative of a binary one and a binary zero during an interval when a pulse from said source of system clock pulses is present, a data out driver connected to the output of said amplifier via a signal path, a latch circuit connected in parallel with said signal path, said latch being set by the complement of said pulse such that said data out driver is activated by the overlapping of one of said output signals and the output of said latch circuit until said latch is reset;

said latch circuit includes control means connected to said latch responsive to a signal representative of the complement of said pulse and to a reset signal for applying one of a high and low latch output signal to said signal path when one of said output signals is applied from said amplifier to said latch and said complement of said pulse activates said control means; and a logical circuit means connected to the input of said latch for setting said latch when said one of said output signals and the complement of said system clock pulse are applied simultaneously to said input of said latch;

said logical circuit means includes a dotted AND interconnection which connects said sense/read amplifier and a source of the complement of said pulse to the input of said latch.

12. A circuit for extending the data valid time for a data output driver which includes a source of system clock pulses comprising, a sense/read amplifier which provides output signals representative of a binary one and a binary zero during an interval when a pulse from said source of system clock pulses is present, a data out driver connected to the output of said amplifier via a signal path, a latch circuit connected in parallel with said signal path, said latch being set by the complement of said pulse such that said data out driver is activated by the overlapping of one of said output signals and the output of said latch circuit until said latch is reset;

said latch circuit includes control means connected to said latch responsive to a signal representative of the complement of said pulse and to a reset signal for applying one of a high and low latch output signal to said signal path when one of said output signals is applied from said amplifier to said latch and said complement of said pulse activates said control means; and a logical circuit means the output of which is connected to said data out driver and one input of which is connected to said latch and the other input of which is connected to said sense/read amplifier, wherein said logical circuit means is an OR gate.

13. A circuit for extending the data valid time for a data output driver which includes a source of system clock pulses comprising, a data output driver circuit, a sense/read amplifier connected to said data output driver via a signal path which provides one of a high and low signal during an interval when a pulse from said source of system clock pulses is present, means disposed in parallel with said signal path for generating a signal like said one of said high and low signal during an interval when the complement of said pulse enables said means for generating, and interconnection means connected to said means for generating and said signal path such that said interconnection means functions as a logical OR from the time of initiation of said one of a high and low signal to the termination of said complement of said pulse to one of activate and inhibit said data output driver circuit and as a logical AND when said one of a high and low signal and the complement of said pulse are applied to said means for generating.

14. A circuit according to claim 13 wherein said means for generating includes a resettable latch connected to said signal path via said interconnection means.

15. A circuit according to claim 14 wherein said means for generating includes control means connected to said resettable latch responsive to a signal representative of the complement of said pulse and to a reset signal.

* * * * *